United States Patent

Ricca et al.

[11] Patent Number: 5,918,198
[45] Date of Patent: Jun. 29, 1999

[54] GENERATING PULSES IN ANALOG CHANNEL OF ATE TESTER

[75] Inventors: Paolo Dalla Ricca, San Jose; Daniel Rosenthal, Saratoga, both of Calif.

[73] Assignee: Schlumberger Technologies Inc., San Jose, Calif.

[21] Appl. No.: 08/734,994

[22] Filed: Oct. 22, 1996

[51] Int. Cl.[6] .................................................. G01R 31/28
[52] U.S. Cl. ........................... 702/110; 702/78; 364/607; 371/27.7; 341/152
[58] Field of Search ........................... 364/580, 480–487, 364/578, 602, 607, 608, 807, 851, 852; 324/500, 537, 754, 755, 759, 761, 765; 371/22.1–28; 341/152; 702/110, 78

[56] References Cited

U.S. PATENT DOCUMENTS

| | | | |
|---|---|---|---|
| 5,065,370 | 11/1991 | Rizkowski et al. | 367/3 |
| 5,230,008 | 7/1993 | Duch et al. | 375/19 |
| 5,309,514 | 5/1994 | Johnson et al. | 380/10 |
| 5,644,311 | 7/1997 | Choudhury et al. | 341/152 |
| 5,646,521 | 7/1997 | Rosenthal et al. | 324/158.1 |

*Primary Examiner*—Kamimi Shah
*Attorney, Agent, or Firm*—Fish & Richardson P.C.

[57] ABSTRACT

A method simulating the filtering of a current pulse in a series of pulses. The method includes receiving a series of n+1 consecutive pulse addresses, including a pulse address for the current pulse as the last in the series of n+1, each pulse address being in a range of m values; storing the n pulses addresses prior to the current pulse address; building a composite address from the current pulse address and the prior n pulse addresses and applying the composite address to read a pulse shape from a memory of at least $m^{n+1}$ pulse shapes. Also, apparatus issuing high speed pulses of programmable length. The apparatus includes a field of programmable memory to store a pulse length; a pulse clock line carrying a pulse clock signal having a pulse frequency; a frequency multiplier connected to receive the pulse clock signal and the pulse length stored in the programmable memory field and producing a sample clock signal having a frequency equal to the pulse length times the pulse clock frequency; a pulse memory holding the samples for a pulse; a DAC coupled to the pulse memory and generating analog pulses from samples received from the pulse memory; and a signal path carrying the sample clock signal to set the sampling frequency of a DAC and to clock samples from the pulse memory to the DAC.

20 Claims, 6 Drawing Sheets

GENERATING PULSES IN ANALOG CHANNEL OF ATE TESTER

BACKGROUND

The present invention relates to the generation of pulses in automatic test equipment (ATE) for testing circuits, such as integrated circuits or circuit boards. More particularly, the present invention relates to generating analog pulse in an analog channel of a mixed-signal tester.

Digital integrated circuit (IC) devices are typically tested by applying to pins of the device a pattern of binary stimulus signals in pre-determined patterns and timing relationships. The test system looks at the resulting digital output signals of the device and compares them to a pre-defined truth table. A pass or fail decision results, depending on whether the bits (1's and 0's) at the device's output pins match the bits of the truth table during each time interval. Test systems for such devices are flexible and programmable to suit the requirements of the type of device to be tested. An example of a high-speed, programmable digital test system is the ITS 9000FX system, available from Schlumberger Technologies of San Jose, Calif.

Other devices to be tested are not purely digital. Such devices, known as mixed-signal devices, can have both digital and analog signal characteristics. Mixed-signal devices are mostly digital, but cannot be tested the way purely digital devices are tested.

The networking and data storage markets have recently seen the introduction of devices capable of handling high speed (>100 Mbps) serial data. The data are usually corrupted by physical interactions occurring in the transmission link or in the process of storing and retrieving the data.

One function of receivers for such data is to recover the original information by means of complex analog and/or digital processing and to present the result in digital form. For this reason they are considered mixed-signal devices.

SUMMARY

In general, in one aspect, the invention features a method simulating the filtering of a current pulse in a series of pulses. The method includes receiving a series of n+1 consecutive pulse addresses, including a pulse address for the current pulse as the last in the series of n+1, each pulse address being in a range of m values; storing the n pulses addresses prior to the current pulse address; building a composite address from the current pulse address and the prior n pulse addresses and applying the composite address to read a pulse shape from a memory of at least $m^{n+1}$ pulse shapes.

In general, in another aspect, the invention features apparatus issuing high speed pulses of programmable length. The apparatus includes a field of programmable memory to store a pulse length; a pulse clock line carrying a pulse clock signal having a pulse frequency; a frequency multiplier connected to receive the pulse clock signal and the pulse length stored in the programmable memory field and producing a sample clock signal having a frequency equal to the pulse length times the pulse clock frequency; a pulse memory holding the samples for a pulse; a DAC coupled to the pulse memory and generating analog pulses from samples received from the pulse memory; and a signal path carrying the sample clock signal to set the sampling frequency of a DAC and to clock samples from the pulse memory to the DAC.

Among the advantages of the invention are one or more of the following. The architecture is pulse oriented and can issue high speed pulses of preprogrammable length. The programming and addressing strategy of the pulse shape memory can buffer consecutive pulses to achieve high speed pulse generation with reasonable memory access time. The programming and addressing strategy of the pulse shape memory can simulate a filtering or distortion on issued pulses. Use of the pulse distortion function is advantageous because digital filtering at greater than 1 Gsps ($1 \times 10^9$ samples per second) is impractical with conventional DSP-based architectures, while programmable analog filtering requires many configuration relays with consequent problems of parasitic effects and a limited set of selectable time constants and topologies. The flexibility in programming distortions is greater than that available in analog programming. Unlike an analog filter implementation, the invention enables one to program a change in pulse distortions on the fly, that is, without interrupting the flow of data to the circuit under test, and this can be done on a per-vector basis.

Other features and advantages of the invention will become apparent from the following description and from the claims.

DETAILED DESCRIPTION

Figure 1:
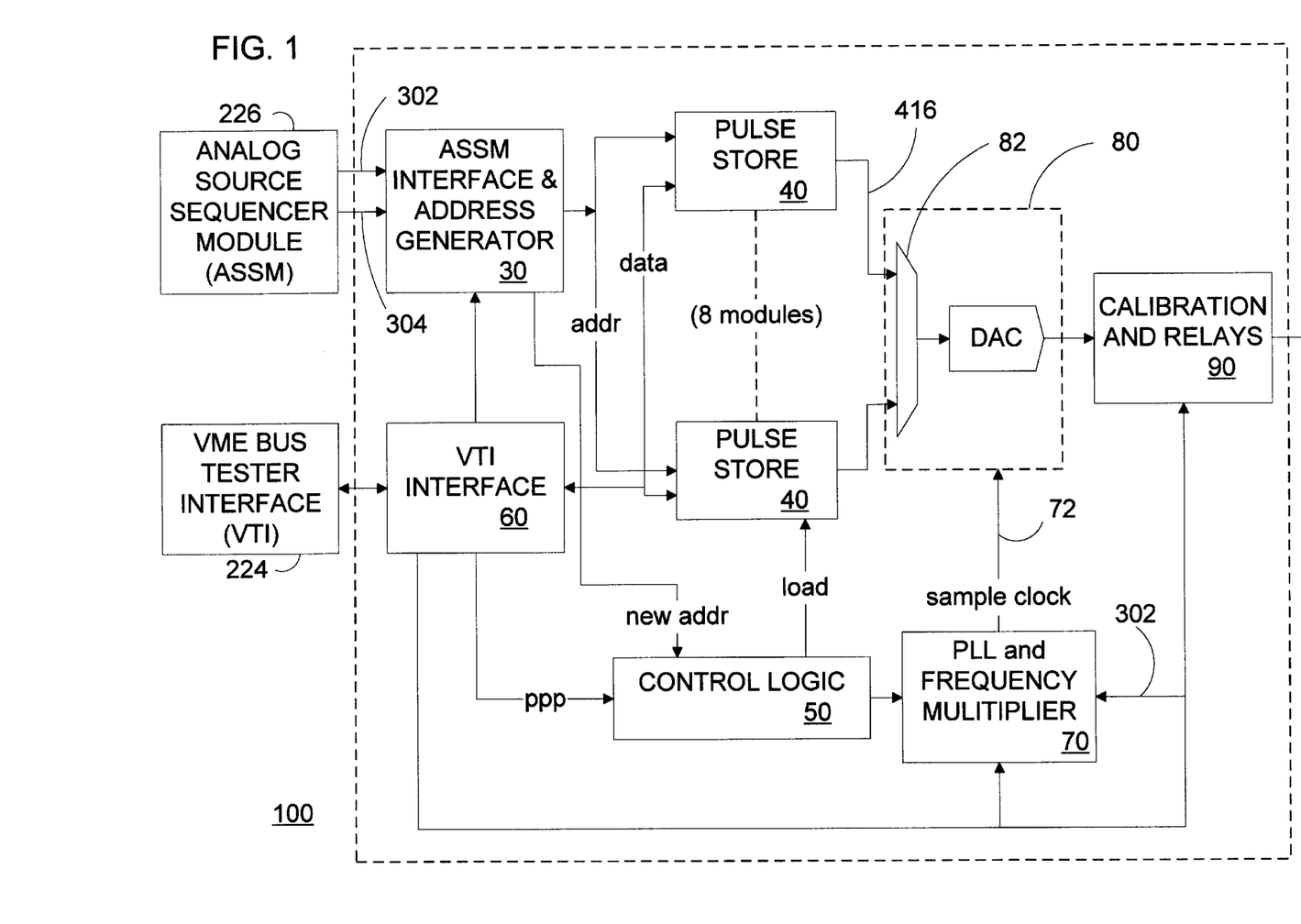
FIG. 1 is a block diagram of a pulse shaper in accordance with the present invention.

Referring to FIG. 1, a pulse shaper 100 operates to provide pulses, i.e., fast analog waveforms of fixed length and variable shape, to stimulate a device under test. The pulse shaper 100 is implemented as a pin electronics board designed to form part of an analog channel of a mixed-signal ATE tester, such as the channel and tester described in commonly-owned, copending U.S. patent application Ser. No. 08/510,397 for "Analog Channel for Mixed-Signal-VLSI Tester", the disclosure of which is incorporated here by this reference. In such a tester, the board can be used to perform complex tests where the time relation with the digital section is known and accurate.

The pulse shaper 100 includes circuitry to store and reproduce pulses of programmable length. This circuitry can be divided into seven conceptual building blocks:

(1) Asynchronous Source Sequence Module (ASSM) bus interface and address generator block 30;
(2) Bit slice memory modules 40, of which there are eight;
(3) Control logic 50;
(4) VME bus to tester interface (VTI) interface 60;
(5) PLL Frequency Multiplier 70;
(6) High-speed DAC 80; and
(7) Output calibration and relays 90.

Figure 2:
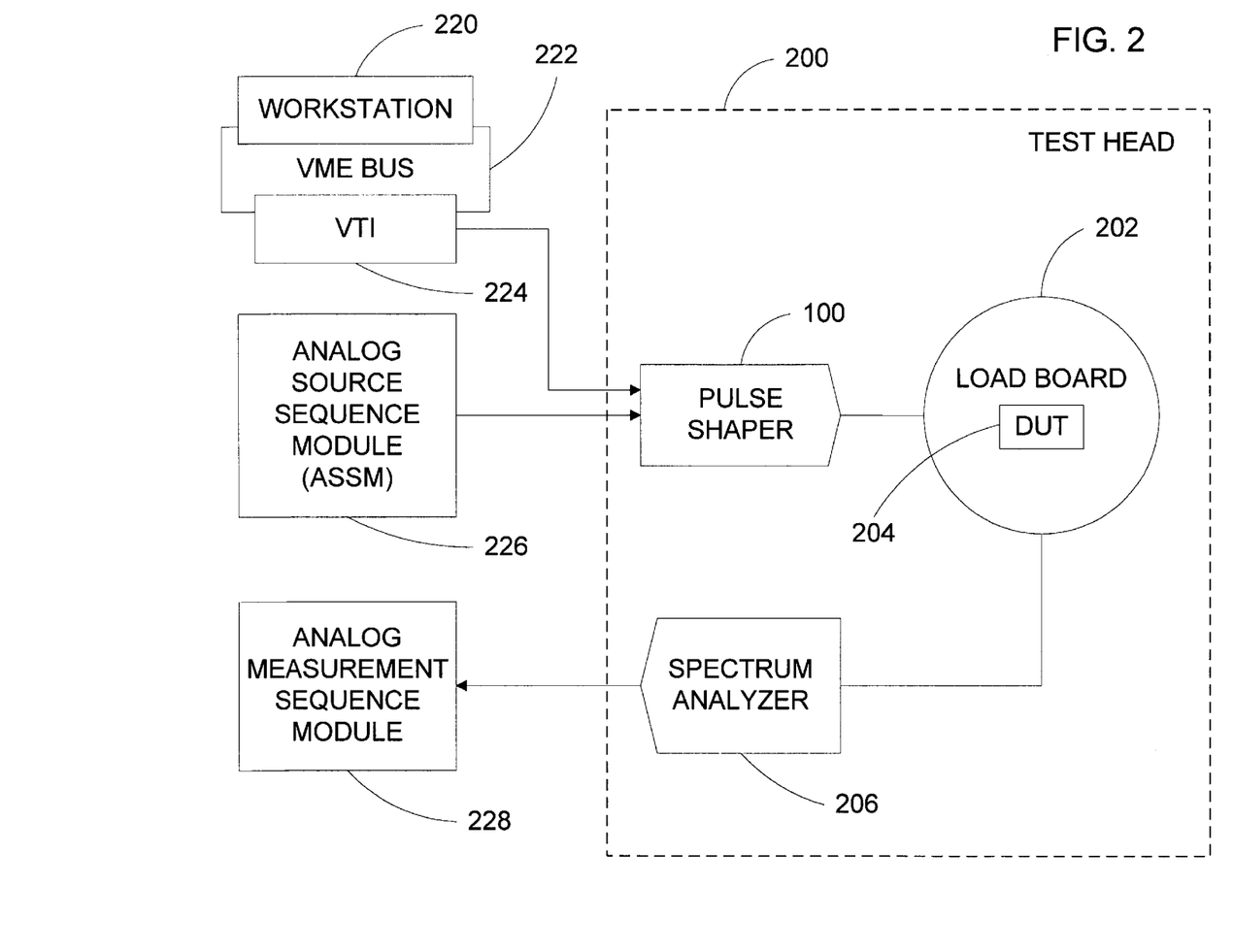
FIG. 2 is a schematic block diagram showing the pulse shaper as part of an analog channel of a mixed-signal tester.

Referring to FIG. 2, a pulse shaper 100 can fit on a pin electronics source board for a tester test head 200. Pulses are loaded in digital form into a local memory (shown in FIG. 4) of the pulse shaper 100 under control of a workstation 220 through VME Bus 222 and VME Bus to Tester Interface (VTI) 224 before testing begins. This allows maximum speed of operation and dynamic selection of the pulses. During testing, the pulse shaper 100 is driven by an analog source sequence module (ASSM) 226 to provide analog pulses for the device under test (DUT) 204 on the load board 202 of the test head 200. The output of the stimulated DUT is measured with a spectrum analyzer 206 and passed to an analog measurement sequence module 228 for storage and post-processing and analysis by other modules of the tester (not shown).

Referring to FIG. 1 again, the primary function of the pulse shaper 100 within a tester is to generate fast analog waveforms of a programmable fixed length and variable shape. It has the following basic features. The sample rate is limited by the speed of a high-speed digital-to-analog converter (DAC) 80. A suitable DAC for this application is the TQ6122, an 8-bit, 2-way input-multiplexed GaAs DAC available from TriQuint Semiconductor of Beaverton, Oreg. The resolution of this DAC is 8 bits and complementary outputs are provided. It has multiplexed input through multiplexer 82. This DAC can typically be operated at up to 1.3 Gsps for multiplexed operation if it is properly cooled. Calibration and relays block 90 provides gain for the output signals from the high-speed DAC 80; it also provides for the programming, through the VTI interface 60, of gain and offset calibration, and of the connection of the DAC output to the signal path to the device under test.

Memory to store pulse shapes is provided in pulse stores 40, of which there are eight modules, one for each bit of resolution of the DAC 80. The eight modules together provide the eight bits of resolution of each point (sample) of a pulse. Each module 40 is addressable by an address of at least 16 bits, which may represent one or more pulses as will be described. Each pulse store is a slice memory module that is addressable to produce a word of 16 bits per pulse. (However, the setting of the programmed number of points per pulse may cause less than all 16 bits to be used.) Each module 40 has two memories A and B that are read in alternation, as will be described in reference to FIG. 4. Normally, the memories A and B will be programmed with identical patterns, so that an incoming pulse address will generate the same output without regard to the state of the alternation between A and B. However, this memory structure can also be programmed to exploit the alternation and generate an arbitrary waveform up to the size of the memory.

The number of points (8-bit samples) per pulse is programmable through the VTI interface 60 and the control logic 50. The sample frequency is phase locked with the pulse frequency, on pulse clock line 302, by PLL and frequency multiplier 70.

The PLL and frequency multiplier block 70 creates the sample clock signal on line 72 for the pulse shaper logic and for the high-speed DAC. This signal is phase locked with the pulse clock signal from the ASSM. The ratio of the sample clock frequency to the pulse clock frequency is 3, 4, 5, 6, 7, 8, 10, 12, 14, or 16, according to the programmed number of points (samples) per pulse.

Figure 3:
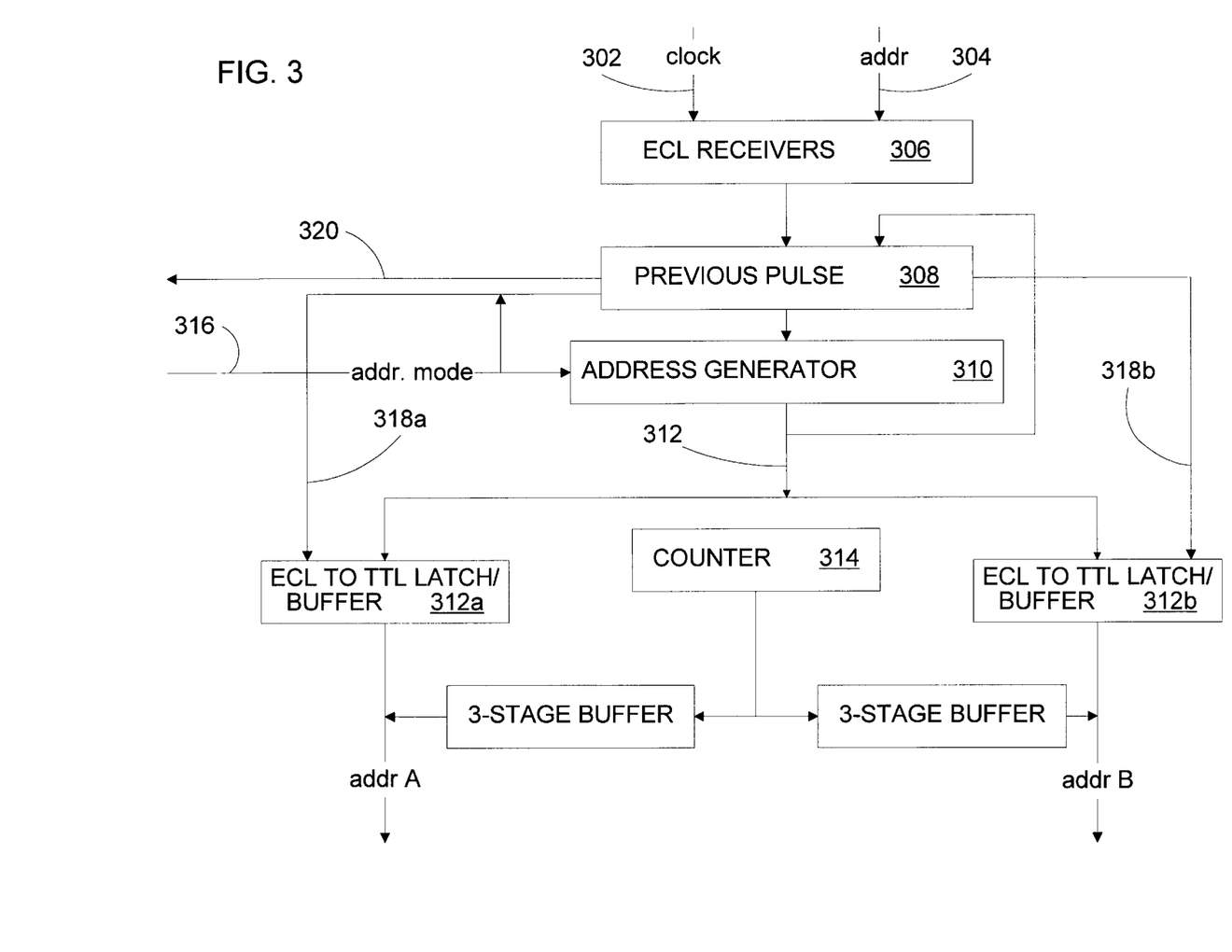
FIG. 3 is a block diagram of an interface and address generator of the pulse shaper.

Referring to FIG. 3, the ASSM bus interface and address generator block 30 has a stage of ECL receivers 306 that provides the interface for the pulse clock (line 302) and for data lines 304, which include the address lines by which the ASSM provides the next pulse address. How many of these lines are used depends on the programmed number of points per pulse (ppp). If the number is 8 ppp, for example, only 8 address lines will be used, because the maximum number of different pulses at 8 ppp is 256, as will be described. Similarly, if the number is 3 ppp, only 4 address lines will be used, because the maximum number of different pulses is 16.

The pulse addresses received from the ASSM by the ECL receivers 306 are passed through previous pulse block 308 and address generator 310 to form a pulse store address on lines 312, which address is used to address the pulse stores 40. One, two, or four pulse addresses (according to the programmed number of points per pulse) from the ECL receivers 306 are combined to form a pulse store address. The previous pulse block acts as a multiplexer accumulating pulse addresses, as will be described. The width of pulse address on lines 304, and the corresponding size of local memories A and B, may be of any width, and in particular may exceed 16 bits. However, for reasons that will be described, when the number of points per pulse is 8 or less, the width of the pulse addresses incoming on lines 304 is limited as will be described, and the pulse store address provided to the memories A and B is limited to 16 bits.

Figure 6:
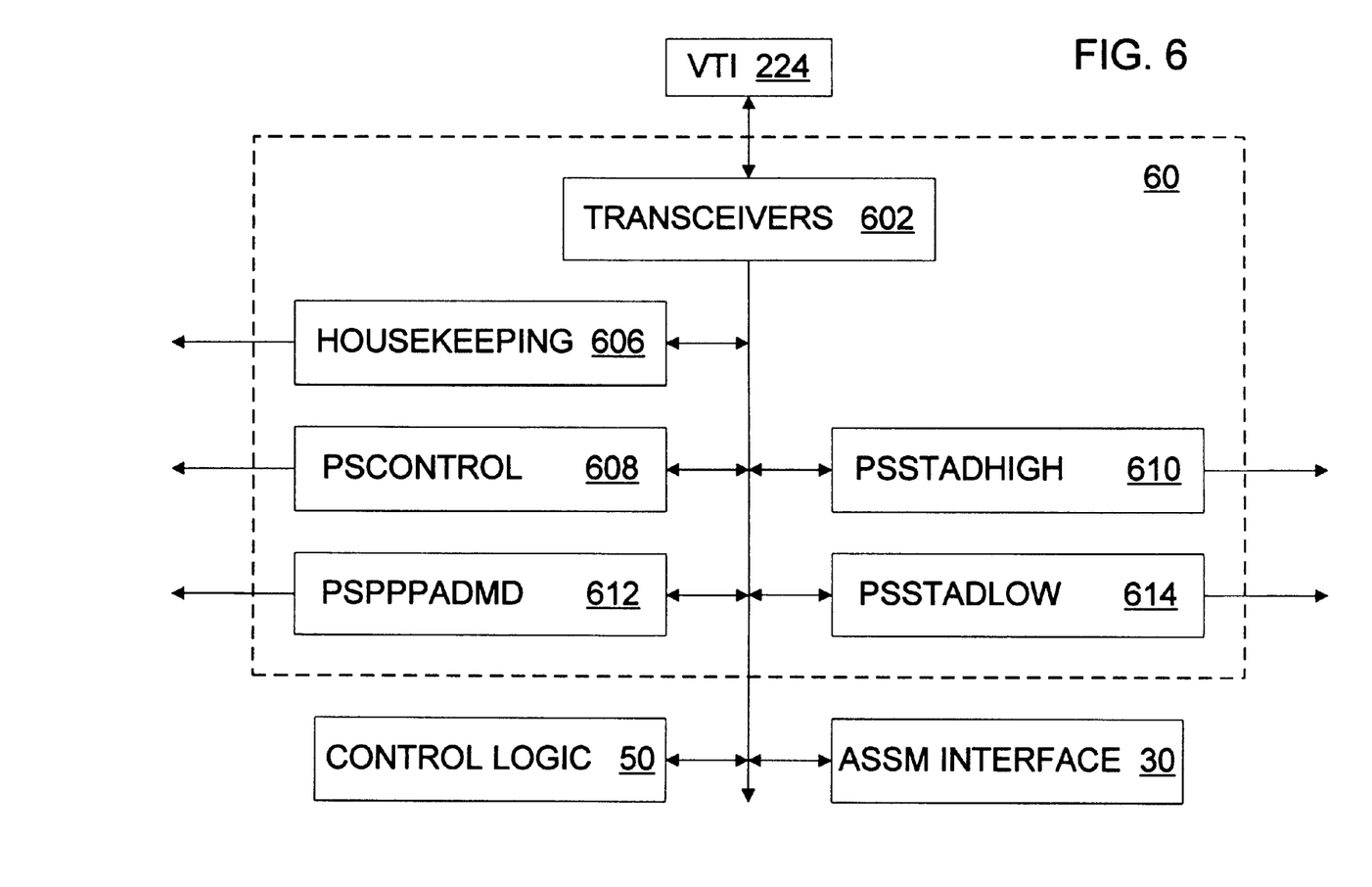
FIG. 6 is a block diagram of pulse shaper control registers and a controlling computer.

The distortion simulation function also uses the multiplexing operation of previous pulse block 308. Distortion simulation is activated by setting to non-zero the address mode (received on line 316) in the VTI interface 60. This will be described in reference to the PSPPPADMD register 612 (FIG. 6).

To simulate a distortion or filtering action, the pulse shaper is programmed so that its output of a pulse depends on a limited number of previously selected pulses. In this way, each pulse can be defined to have the shape that it would have when preceded by any combination of n preceding pulses. If m is the number of pulses defined and n is the number of previous pulses that have an appreciable effect on the current pulse, $m^{n+1}$ different pulses are required (ignoring possible duplicates).

With pulse store memories 402 and 404 (FIG. 4) configured with 64K 16-bit words, the useful values for n are 1, 3, and 7, and the following limitations apply.

Figure 4:
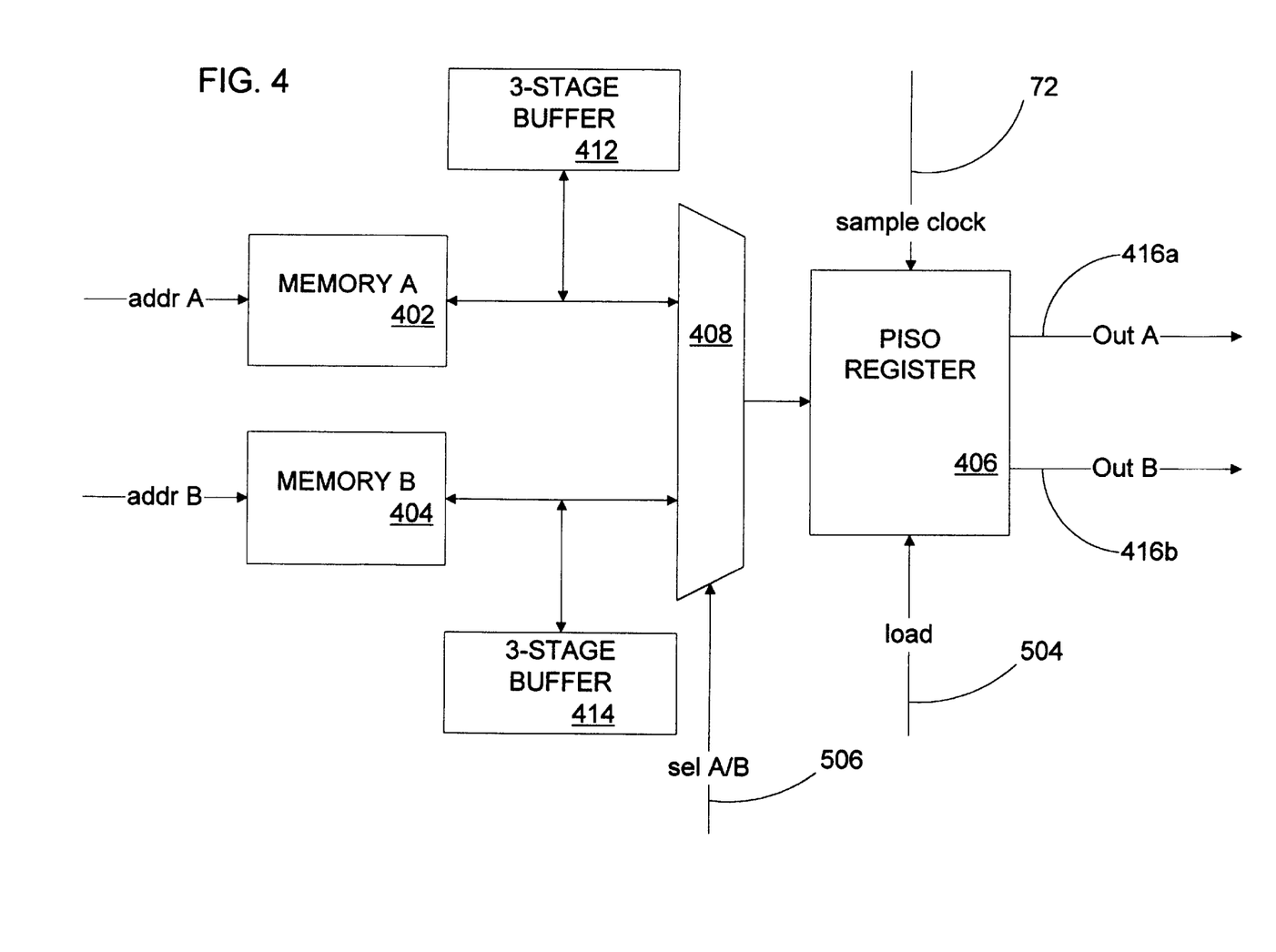
FIG. 4 is a block diagram of a pulse storage memory module of the pulse shaper.

| Memory of previous pulses (n) | Different pulses (m) |
|---|---|
| 1 | 256 |
| 3 | 16 |
| 7 | 4 |

If n is 1, the previous pulse block 308 combines 8 bits of pulse address (the "current" pulse address) from the ECL receivers 306 with the most recent 8 bits of address from the address generator 310 to build a 16-bit pulse store address (lines 312). If n is 3, 4 bits of the current pulse address from the ECL receivers 306 are combined with the three most recent 4-bit pulse addresses (i.e., with the most recent 12 bits of address from the address generator 310); and if n is 7, the current and seven most recent 2-bit addresses are combined. In all cases, the number of points per pulse must be 10 or more to stay within the speed limitation of the memory.

The pulse store address, however formed, is transmitted on lines 312 to a pair of ECL-to-TTL level shifter and 3-state buffer latches A and B (312a and 312b); and the new address signal (on line 320) is generated to mark the boundary between pulse store addresses. The address data is alternately latched to latches A and B by the alternation of the latch A and latch B signals on lines 318a and 318b, respectively.

To write sample data to, or read sample data from, the memories, a counter 314 is programmed through the VTI interface 60 with the memory address at which the reading or writing is to begin. Thereafter, every read or write operation automatically increments this counter.

The address selection logic that has been described is implemented in ECL logic to provide correct operation at the highest data rates from the ASSM, while the memory blocks may be implemented in Bi-CMOS technology to achieve a good balance of storage capacity, access time, and power consumption.

Referring to FIG. 4, the bit slice module 40 is replicated eight times, once for each of the 8 bits of resolution of the high-speed DAC. In operation, 16-bit words from memories A 402 and B 404 are alternately loaded into the PISO (parallel-in, serial-out) register 406. The alternation is effected by combination multiplexer and level shifter 408 in response to signal select A/B on line 506. The PISO register 406 converts the data into a serial stream to be sent to the high-speed DAC on lines 416a and 416b, alternately. The combination multiplexer and level shifter 408 also provides TTL-to-ECL level conversion. Three-state buffers 412 and 414 provide access to the memories A 402 and B 404, respectively, during programming, and they provide isolation during normal (pulse generating) operation.

Figure 5:
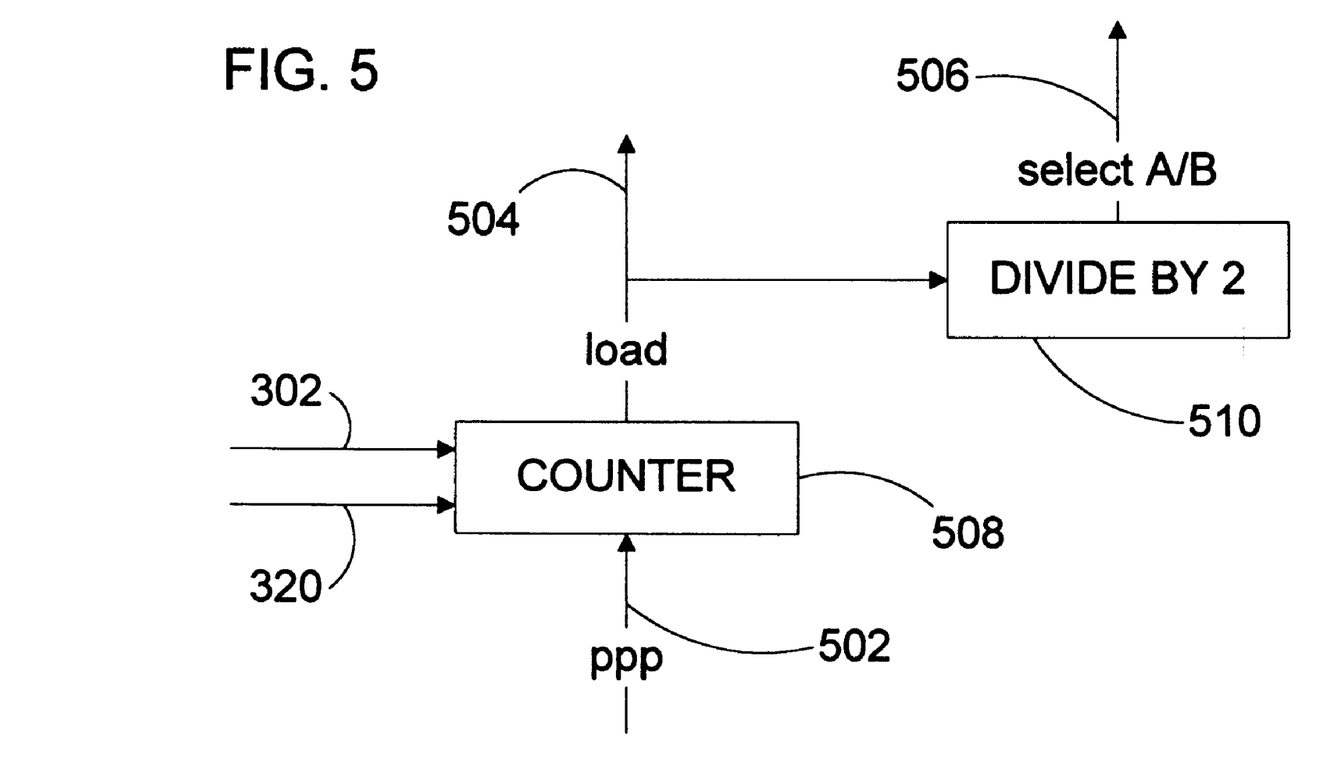
FIG. 5 is a block diagram of control logic of the pulse shaper.

Referring to FIG. 5, the control logic block 50 receives the number of points per pulse on lines 502, the ASSM pulse clock on line 302, and the new address signal on line 320. From these signals it generates in counter 508 the load pulses for PISO register 406 (FIG. 4) on line 504; and in divider 510 it generates select pulses for the multiplexer 408 (FIG. 4) on line 506. The load pulses and select pulses are synchronized with the new address signal, which comes from the previous pulse block 308 (FIG. 3) on line 320 to obtain a fixed phase relation with the pulse clock signal (line 302) and other signals coming from the ASSM.

Referring to FIG. 6, the block 606 of housekeeping and general configuration registers provides general programming and information on pulse shaper configuration and status.

The PSSTADHIGH register 610 defines the high order bits of the start address used when programming the local memories. Three of the bits select the output bits 0–7 (i.e., they select one of the eight pulse stores 40 (FIGS. 1 and 4); and one bit selects the leaf 0 or 1, i.e., memory A 402 or memory B 404 (FIG. 4).

The PSSTADLOW register 614 defines the lowest 16 bits of the start address for programming a bit slice memory A and B.

The PSPPPADMD register 612 holds the addressing mode (line 316, FIG. 3), which controls activation of the distortion function, and the number of points (samples) per pulse (ppp). Four bits hold the number of points per pulse; legal values (in hexadecimal) are 2, 3, 4, 5, 6, 7, 9, B, D, and F. The value 2 is taken to denote 3 points per pulse; F, to denote 16 (decimal) points per pulse. The software that programs the tester would verify that the product of the points per pulse and pulse frequency does not exceed the maximum frequency of the high-speed DAC. Two bits (address mode) select the pulse distortion functions: 0=no pulse distortion (pulse comes from ASSM); 1=distortion with memory of 1 previous pulse; 2=distortion with memory of 3 previous pulses; and 3=distortion with memory of 7 previous pulses. Writing the designated bits selects the designated function.

The limits for the pulse shaper configuration that has been described are summarized in the following table.

| Points per pulse | max pulse rate | max diff. pulses | sample clock/pulse clock | Delay (pulses) |
| --- | --- | --- | --- | --- |
| 16 | 75 MHZ | 64K | 16 | 2 |
| 14 | 85.7 MHZ | 64K | 14 | 2 |
| 12 | 100 MHZ | 64K | 12 | 2 |
| 10 | 120 MHZ | 64K | 10 | 2 |
| 8 | 150 MHZ | 256 | 8 | 4 |
| 7 | 171.4 MHZ | 256 | 7 | 4 |
| 6 | 200 MHZ | 256 | 6 | 4 |
| 5 | 240 MHZ | 256 | 5 | 4 |
| 4 | 300 MHZ | 16 | 4 | 8 |
| 3 | 400 MHZ | 16 | 3 | 8 |

The number of points per pulse will affects the maximum number of pulses available according to the preceding table.

The maximum pulse rate shown above reflects only a 1.2 Gsps maximum rate of the high-speed DAC; however, it may be limited by other aspects of the tester, for example, the speed of the ASSM (i.e., the maximum frequency of the pulse clock signal).

Referring to FIG. 4 again, more than 16 samples per pulse can be obtained by programming the shapes stored in the bit slice modules 40 and having the ASSM issue each pulse address twice in the sequence of pulse addresses. In particular, it is possible to have 64K different pulses of lengths of 20, 24, 28, or 32 samples by storing a half waveform in the memory A 402 and a half waveform in memory B 404. The ratios between the local clock and the pulse clock will be 10, 12, 14, or 16 respectively. When a particular address is first issued, it goes to one of the memories—memory A, for example. When it is issued again, it goes to memory B. Normally, memory A and memory B would be programmed with the same sample data for each pulse address. However, when the memories are programmed with different, half waveform samples, longer pulses can be obtained.

Similarly, by programming the ASSM to issue each pulse twice from address 0 to an address up to the maximum address recognizable by the pulse store memories A 402 and B 404, an arbitrary array of samples of a length limited only by memory capacity can readily be generated.

Referring to FIG. 6 again, the PSCONTROL register 608 holds the operating mode of halt, standby, or running. Writing its status bits changes the mode. Other bits of the register are used to report error conditions. The halt state is used to program the pulse store memories and set the registers. No pulses are issued in this state and the ASSM is ignored. In the standby state, the pulse store memories have been programmed and the pulse shaper waits for the locking of the PLL to the pulse clock signal (about 100 µs). In the running state, the pulse shaper receives from the ASSM a pulse clock signal (line 302) and data (line 304, FIG. 3), the PLL is locked, and the pulse shaper executes commands from the ASSM to issue pulses.

To allow use of the pulse shaper in applications requiring different peak to peak voltages, while keeping 8 bit resolution, the output voltage range can be programmed by setting a register (not shown) in VTI interface 60. This acts on an auxiliary DAC controlling the reference voltage of the primary one. Another DAC allows calibration for fine adjustment.

To allow use of the pulse shaper in applications requiring different offsets, the output offset range can be programmed by setting a register (not shown) in VTI interface 60. This will acts on an auxiliary DAC controlling current in a summing node. Another DAC allows calibration for fine adjustment.

Other embodiments are within the scope of the following claims.

What is claimed is:

1. A method simulating the filtering of a current pulse in a series of pulses, comprising:

receiving a series of n+1 consecutive pulse addresses, including a pulse address for the current pulse as the last in the series of n+1, each pulse address being in a range of m values;

storing the n pulse addresses prior to the current pulse address;

building a composite address from the current pulse address and the prior n pulse addresses and applying the composite address to read a pulse shape from a memory of at least $m^{n+1}$ pulse shapes.

2. The method of claim 1 where n is selected from the group consisting of 1, 3, and 7; and $m^{n+1}$ is $2^{16}$.

3. The method of claim 1 where the memory of pulse shapes provides 10 or more sample points per pulse.

4. The method of claim 1 where the memory of pulse shapes provides 8 or more bits of resolution per sample point.

5. Apparatus generating sample points defining a pulse, comprising:

address terminals carrying pulse addresses, each pulse address being in a range of m values;

a pulse memory coupled to the address terminals and storing the n most recent pulse addresses appearing on the address terminals prior to a current pulse address; and a pulse shape memory having memory locations to store at least $m^{n+1}$ pulse shapes and coupled to the pulse memory to receive a composite address input formed from the n most recent pulse addresses and the current pulse address.

6. The apparatus of claim 5 further comprising:

address mode terminals carrying an address mode signal; where:

the address mode terminals are coupled to the pulse memory and the pulse memory response to the address mode signal to determine the number n of pulse addresses to store.

7. The apparatus of claim 5 where n is selected from the group consisting of 1, 3, and 7; and $m^{n+1}$ is $2^{16}$.

8. The apparatus of claim 5 where the memory of pulse shapes memory locations store 10 or more sample points per pulse shape.

9. The apparatus of claim 5 where the memory locations of the memory of pulse shapes store 8 or more bits of resolution per sample point of a pulse shape.

10. Apparatus issuing high speed pulses of programmable length, comprising:

a field of programmable memory to store a pulse length;

a pulse clock line carrying a pulse clock signal having a pulse frequency;

a frequency multiplier connected to receive the pulse clock signal and the pulse length stored in the programmable memory field and producing a sample clock signal having a frequency equal to the pulse length times the pulse clock frequency;

a pulse memory holding the samples for a pulse;

a DAC coupled to the pulse memory and generating analog pulses from samples received from the pulse memory; and a signal path carrying the sample clock signal to set the sampling frequency of a DAC and to clock samples from the pulse memory to the DAC.

11. The apparatus of claim 10 where the DAC has a sampling frequency of at least 1 Gsps and a resolution of at least 8 bits.

12. The apparatus of claim 10 where the pulse length is selected from a group consisting of 3, 4, 5, 6, 7, 8, 10, 12, 14, and 16 samples per pulse.

13. The apparatus of claim 10 where the pulse frequency is in the range of 75 MHz to 400 MHz.

14. The apparatus of claim 10 further comprising:

a set of pulse address input lines carrying pulse address signals synchronized to the pulse clock signal; and an address generator circuit connected to the pulse address input lines and to the pulse memory and converting pulse addresses to addresses for the pulse shape memory.

15. A method issuing high speed pulses of programmable length, comprising:

receiving a pulse length L;

receiving a sequence of pulse addresses;

selecting an addressable block of S pulse samples from a pulse sample memory according to an address built from N consecutive pulse addresses in the sequence, where N does not exceed S/L; and transferring N×L pulse samples from the block to a high-speed DAC.

16. The method of claim 15 where the rate of transferring is at least 1 Gsps.

17. The method of claim 15 where the pulse length L is selected from a group consisting of 3, 4, 5, 6, 7, 8, 10, 12, 14, and 16 samples per pulse and the block size S is 16 samples.

18. The method of claim 15 where the ratio S:L is exactly 1, 2, or 4 and is equal to N.

19. The method of claim 15 further comprising:

storing N samples of pulse length L in consecutive sample positions in an addressable block of the pulse sample memory before receiving the sequence of pulse addresses.

20. The method of claim 1, further comprising:

receiving a next pulse address as the next consecutive pulse address after the series of n+1 consecutive pulse addresses;

storing the n consecutive pulse addresses received immediately prior to the receipt of the next pulse address;

building a next composite address from the next pulse address and the n pulse addresses received prior to the next pulse address and applying the next composite address to read a next pulse shape from the memory of pulse shapes.

* * * * *